(12) United States Patent
McLellan et al.

(10) Patent No.: US 8,314,474 B2
(45) Date of Patent: Nov. 20, 2012

(54) UNDER BUMP METALLIZATION FOR ON-DIE CAPACITOR

(75) Inventors: Neil McLellan, Toronto (CA); Fei Guo, Richmond Hill (CA); Daniel Chung, North York (CA); Terence Cheung, Toronto (CA)

(73) Assignee: ATI Technologies ULC, Markham (CA)

( * ) Notice: Subject to any disclaimer, the term of this patent is extended or adjusted under 35 U.S.C. 154(b) by 432 days.

(21) Appl. No.: 12/180,042

(22) Filed: Jul. 25, 2008

(65) Prior Publication Data

US 2010/0019347 A1    Jan. 28, 2010

(51) Int. Cl.
*H01L 29/00* (2006.01)
*H01L 21/20* (2006.01)

(52) U.S. Cl. .......... 257/532; 257/E21.351; 438/393

(58) Field of Classification Search .......... 257/306, 257/532, 737, 778, E21.35, E21.351; 438/393
See application file for complete search history.

(56) References Cited

U.S. PATENT DOCUMENTS

| | | |
|---|---|---|
| 3,593,319 A | 7/1971 | Barber |
| 4,249,196 A | 2/1981 | Durney et al. |
| 4,409,608 A | 10/1983 | Yoder |
| 4,434,452 A | 2/1984 | Hamabe et al. |
| 4,470,098 A | 9/1984 | Alexander |
| 4,685,197 A | 8/1987 | Tigelaar et al. |
| 4,797,789 A | 1/1989 | Naitoh et al. |
| 4,866,567 A | 9/1989 | Crafts et al. |
| 4,868,613 A | 9/1989 | Hirachi |
| 4,901,128 A | 2/1990 | Sunami et al. |
| 4,914,546 A | 4/1990 | Alter |
| 4,937,649 A | 6/1990 | Shiba et al. |
| 5,053,916 A | 10/1991 | Weekamp et al. |
| 5,081,559 A | 1/1992 | Fazan et al. |
| 5,089,878 A | 2/1992 | Lee |
| 5,155,658 A | 10/1992 | Inam et al. |
| 5,189,594 A | 2/1993 | Hoshiba |
| 5,208,725 A | 5/1993 | Akcasu |
| 5,656,863 A | 8/1997 | Yasunaga et al. |
| 5,668,399 A * | 9/1997 | Cronin et al. .......... 257/532 |
| 5,907,785 A | 5/1999 | Palagonia |
| 6,384,343 B1 | 5/2002 | Furusawa |
| 6,387,795 B1 | 5/2002 | Shao |
| 6,433,427 B1 | 8/2002 | Wu et al. |
| 6,617,655 B1 | 9/2003 | Estacio et al. |
| 6,656,828 B1 | 12/2003 | Maitani et al. |

(Continued)

FOREIGN PATENT DOCUMENTS

DE      2548563      5/1977

(Continued)

OTHER PUBLICATIONS

PCT/IB2008/002024 International Search Report.

(Continued)

*Primary Examiner* — Matthew W Such
*Assistant Examiner* — Robert Carpenter
(74) *Attorney, Agent, or Firm* — Timothy M. Honeycutt

(57) ABSTRACT

Various on-chip capacitors and methods of making the same are disclosed. In one aspect, a method of manufacturing a capacitor is provided that includes forming a first conductor structure on a semiconductor chip and forming a passivation structure on the first conductor structure. An under bump metallization structure is formed on the passivation structure. The under bump metallization structure overlaps at least a portion of the first conductor structure to provide a capacitor.

30 Claims, 6 Drawing Sheets

U.S. PATENT DOCUMENTS

| | | | |
|---|---|---|---|
| 6,929,976 | B2 | 8/2005 | Chan et al. |
| 6,937,458 | B2 * | 8/2005 | Seshan .................. 361/303 |
| 7,112,884 | B2 | 9/2006 | Bruno |
| 7,161,793 | B2 * | 1/2007 | Kurihara et al. .......... 361/306.3 |
| 7,227,736 | B2 * | 6/2007 | Shioga et al. .............. 361/306.1 |
| 7,364,998 | B2 | 4/2008 | Chiu et al. |
| 2002/0070451 | A1 | 6/2002 | Burnette et al. |
| 2003/0001287 | A1 | 1/2003 | Sathe |
| 2003/0071300 | A1 * | 4/2003 | Yashima et al. ............. 257/310 |
| 2004/0070042 | A1 | 4/2004 | Lee et al. |
| 2004/0104451 | A1 * | 6/2004 | Ooi et al. ..................... 257/532 |
| 2004/0188851 | A1 | 9/2004 | Takewaki et al. |
| 2005/0006688 | A1 * | 1/2005 | Solo De Zaldivar .......... 257/306 |
| 2005/0280034 | A1 | 12/2005 | Hosoyamada et al. |
| 2006/0033197 | A1 | 2/2006 | Seshan |
| 2007/0052095 | A1 | 3/2007 | Torii et al. |
| 2007/0069347 | A1 | 3/2007 | Lin et al. |
| 2007/0132095 | A1 | 6/2007 | Marsanne et al. |
| 2007/0170587 | A1 | 7/2007 | Honda |
| 2007/0176292 | A1 | 8/2007 | Chen et al. |

FOREIGN PATENT DOCUMENTS

| | | | |
|---|---|---|---|
| EP | 0246808 | A1 | 11/1987 |
| EP | 0347853 | A2 | 12/1989 |
| GB | 1149569 | | 4/1969 |
| JP | 5991718 | | 6/1984 |
| JP | 61259560 | A | 11/1986 |
| JP | 61263251 | A | 11/1986 |
| JP | 01084616 | A | 3/1989 |
| JP | 6484616 | | 3/1989 |
| JP | 01096943 | A | 4/1989 |
| JP | 02231755 | A | 9/1990 |
| JP | 4268756 | | 9/1992 |
| JP | 2700959 | | 1/1998 |
| JP | 200031188 | | 1/2000 |
| JP | 2006203261 | | 8/2006 |
| WO | WO 2006/050127 | A2 | 5/2006 |
| WO | WO2006129832 | A1 | 12/2006 |

OTHER PUBLICATIONS

USPTO Office Action mailed Mar. 8, 2010; U.S. Appl. No. 11/832,486.

USPTO Office Action mailed Apr. 1, 2010; U.S. Appl. No. 11/949,951.

USPTO Office Action notification date Jul. 12, 2010; U.S. Appl. No. 11/832,486.

PCT/IB2008/003343 International Search Report.

U.S. Appl. No. 11/832,486, filed Aug. 1, 2007, Roden R. Topacio et al.

U.S. Appl. No. 11/949,951, Dec. 4, 2007, Neil McLellan et al.

Wikipedia; *Benzocyclobutene*; http://en.wikipedia.org/wiki/Benzocyclobutene; Jun. 2007.

Jae-Kyung Wee et al.; *An Antifuse EPROM Circuitry Scheme for Field-Programmable Repair in DRAM*; IEEE Journal of Solid-State Circuits, vol. 35, No. 10, Oct. 2000; pp. 1408-1414.

Tirdad Sowlati et al.; *High Density Capacitance Structures in Submicron CMOS for Low Power RF Applications*; ISLPED '01, Aug. 6-7, 2001; pp. 243-246.

Chi Hou Chan et al.; *Analysis of MMIC Structures Using an Efficient Iterative Approach*; IEEE Transactions on Microwave Theory and Techniques; vol. 36; No. 1; Jan. 1988; pp. 96-105.

Myles H. Wakayama et al.; *A 30-MHz Low-Jitter High-Linearity CMOS Voltage-Controlled Oscillator*; IEEE Journal of Solid-State Circuits; vol. SC-22; No. 6; Dec. 1987; pp. 1074-1081.

T. Ema et al.; *3-Dimensional Stacked Capacitor Cell for 16M and 64M Drams*; 1988 IEEE; pp. 592-595.

Reza Esfandiari et al.; *Design of Interdigitated Capacitors and Their Application to Gallium Arsenide Monolithic Filters*; IEEE Transactions on Microwave Theory and Techniques; vol. 31; No. 1; Jan. 1983; pp. 57-64.

Gary D. Alley; *Interdigital Capacitors and Their Application to Lumped-Element Microwave Integrated Circuits*; IEEE Transactions on Microwave Theory and Techniques; Dec. 1970; pp. 1028-1033.

John L. Hobdell; *Optimization of Interdigital Capacitors*; IEEE Transactions on Microwave Theory and Techniques, vol. MIT-27; No. 9; Sep. 1979; pp. 788-791.

C. Kortekaas; *On-chip Quasi-static Floating-gate Capacitance Measurement Method*; Proc. IEEE 1990 Int. Conference on Microelectric Test Structures; vol. 3; Mar. 1990; pp. 109-113.

USPTO Office Action notification date Feb. 17, 2012; U.S. Appl. No. 13/027,076.

USPTO Notice of Allowance mailed Jun. 28, 2012; U.S. Appl. No. 13/027,076.

\* cited by examiner

UNDER BUMP METALLIZATION FOR ON-DIE CAPACITOR

BACKGROUND OF THE INVENTION

1. Field of the Invention

This invention relates generally to semiconductor processing, and more particularly to methods and apparatus for providing on-die capacitance.

2. Description of the Related Art

Cascode style and other types of circuits, such as those frequently used in microprocessors, graphics processors and application specific integrated circuits, typically require full-voltage and midpoint-voltage power supply rails. In many conventional semiconductor dice, the on-die decoupling capacitance used to suppress power supply noise is typically formed by stacking capacitors from a ground rail to the mid-voltage rail, from the mid-voltage rail to the full-voltage rail, across the full-voltage rail and ground rail.

The minimum device sizes for integrated circuits have been steadily falling for many years. Shrinking device size has resulted in attendant increases in power density and operating frequencies. Depending on the power density and frequency, current fluctuations during transistor switching can cause voltage bounces on the power rails of a chip. If of sufficient magnitude, the voltage bounces can produce timing errors and even device failure.

One conventional method of addressing voltage irregularities on chip rails involves placing capacitors across the power and ground rails. One conventional variant uses a metal oxide semiconductor (MOS) capacitor design. Many such MOS capacitors may be scattered across various locations of a given die. Ideally, a decoupling capacitor is located in close proximity to a switching site in order to keep disruptive capacitor-to-power rail inductance at acceptable levels. In practice, it is often difficult to provide the desired proximity due to layout constraints in the die.

One conventional technique for improving decoupling involves providing more raw capacitance on the die. However, this technique may be severely constrained by the requirements of packing density or will lead to die size growth.

The present invention is directed to overcoming or reducing the effects of one or more of the foregoing disadvantages.

SUMMARY OF THE INVENTION

In accordance with one aspect of the present invention, a method of manufacturing a capacitor is provided that includes forming a first conductor structure on a semiconductor chip and forming a passivation structure on the first conductor structure. An under bump metallization structure is formed on the passivation structure. The under bump metallization structure overlaps at least a portion of the first conductor structure.

In accordance with another aspect of the present invention, a method of manufacturing is provided that includes forming a redistribution layer on a semiconductor chip. The redistribution layer has plural conductor lines. A passivation structure is formed on the redistribution layer. An under bump metallization layer is formed on the passivation structure. The under bump metallization layer has plural under bump metallization structures. The redistribution layer and the under bump metallization layer are formed so that at least one of the plural conductor lines and at least one of the plural under bump structures overlap at least partially but are not ohmically connected to provide a capacitor.

In accordance with another aspect of the present invention, an apparatus is provided that includes a semiconductor chip that has a first conductor structure. A passivation structure is on the first conductor structure and an under bump metallization structure is on the passivation structure. The under bump metallization structure overlaps at least a portion of the first conductor structure but is not ohmically connected to the first conductor structure to establish a capacitor.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
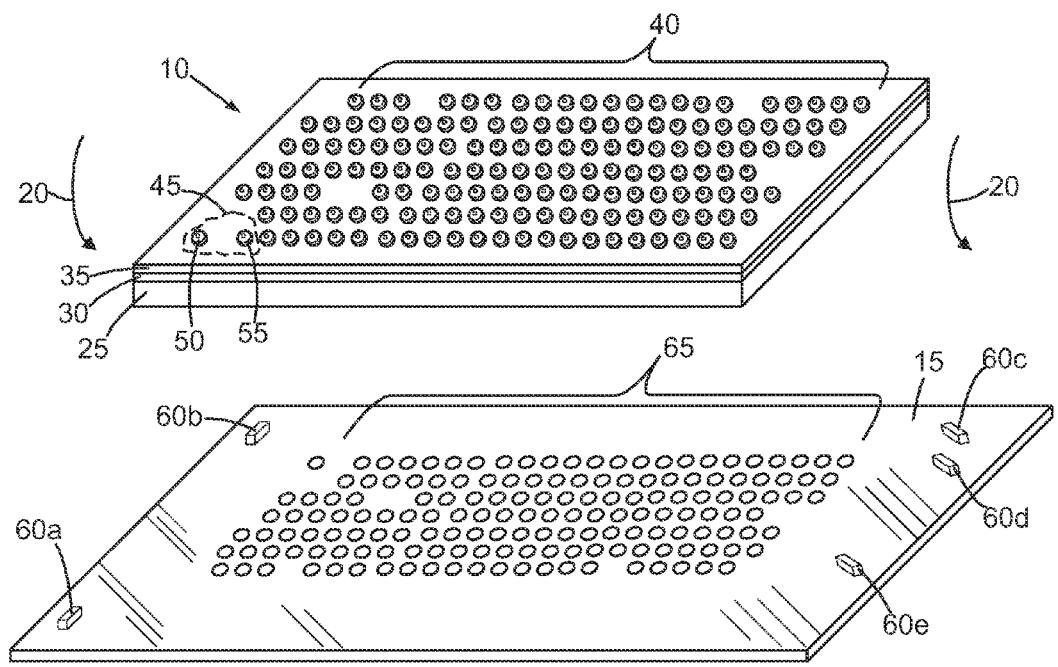
FIG. 1 is a partially exploded pictorial view of an exemplary embodiment of a semiconductor chip and a circuit board.

In the drawings described below, reference numerals are generally repeated where identical elements appear in more than one figure. Turning now to the drawings, and in particular to FIG. 1, therein is shown a partially exploded pictorial view of an exemplary embodiment of a semiconductor chip 10 that is designed to be mounted to a substrate or circuit board 15. In this illustrative embodiment, the semiconductor chip 10 is configured to be flip-chip mounted, that is, flipped over as indicated by the arrows 20 and mounted to the circuit board 15. The semiconductor chip 10 may be any of a myriad of different types of circuit devices used in electronics, such as, for example, microprocessors, graphics processors, combined microprocessor/graphics processors, application specific integrated circuits, memory devices or the like, and may be single or multi-core or even stacked with additional dice. The semiconductor chip 10 includes a base semiconductor portion 25 in which the various active devices and circuits (not visible) are formed, and may include an insulating layer if a semiconductor-on-insulator design is used. The semiconductor chip 10 is not a monolithic structure, but is instead a laminate of multiple layers. A couple of the layers are shown and labeled 30 and 35 respectively. The layer 30 serves as a passivation structure and may be monolithic or consist of a plurality of stacked insulating material layers as described in more detail below. The layer 35 is designed to provide structural protection for conductor structures that are not visible in FIG. 1 but are electrically interconnected to an array 40 of conductor structures that may be solder bumps, conductive pillars or the like. The layer 35 is advantageously composed of polymeric materials, such as polyimide, benzocyclobutene or like polymers. A portion of the semiconductor chip 10 that is circumscribed by the irregularly shaped dashed oval 45 that encompasses two exemplary conductor structures 50 and 55, in this case solder bumps, will be shown removed from the semiconductor chip 10 and at much greater magnification in FIG. 2 to be discussed below.

The circuit board 15 may be a package substrate, a circuit card or other type of printed wiring board. If desired, the circuit board 15 may be electrically connected to another circuit board or card, and may be mounted into virtually any type of computing device, such as a computer, a phone, a controller, a television or the like. Although a monolithic structure could be used for the circuit board 15, a more typical configuration will utilize a build-up design. In this regard, the circuit board 15 may consist of a central core upon which one or more build-up layers are formed and below which an additional one or more build-up layers are formed. The core itself may consist of a stack of one or more layers. One example of such an arrangement may be termed a so called "2-4-2" arrangement where a four-layer core laminated between two sets of two build-up layers. The number of layers in the circuit board 15 can vary from four to sixteen or more, although less than four may be used. So-called "coreless" designs may be used as well. The layers of the circuit board 15 consist of an insulating material, such as various well-known epoxies, interspersed with metal interconnects. A multi-layer configuration other than build-up could be used. Optionally, the circuit board 15 may be composed of well-known ceramics or other materials suitable for package substrate or printed circuit boards. To provide for filtering and other functions, the circuit board 15 may be provided with a plurality of passive devices, a few of which are shown and labeled 60*a*, 60*b*, 60*c*, 60*d* and 60*e*. The passive devices 60*a*, 60*b*, 60*c*, 60*d* and 60*e* may be resistors, capacitors, inductors or other passive devices as desired. The circuit board 15 is provided with a complimentary array 65 of bumps that are designed to metallurgically link with the array 40 of solder bumps of the chip 10 when the chip 10 is mounted to the circuit board 15.

The arrays 40 and 65 of solder bumps may be fabricated from lead-based or lead-free solders. Examples include tin-lead eutectic and non-eutectic compositions, tin-silver, tin-silver-copper or the like. A reflow process is performed to combine the arrays 40 and 65 into an array of solder joints.

Figure 2:
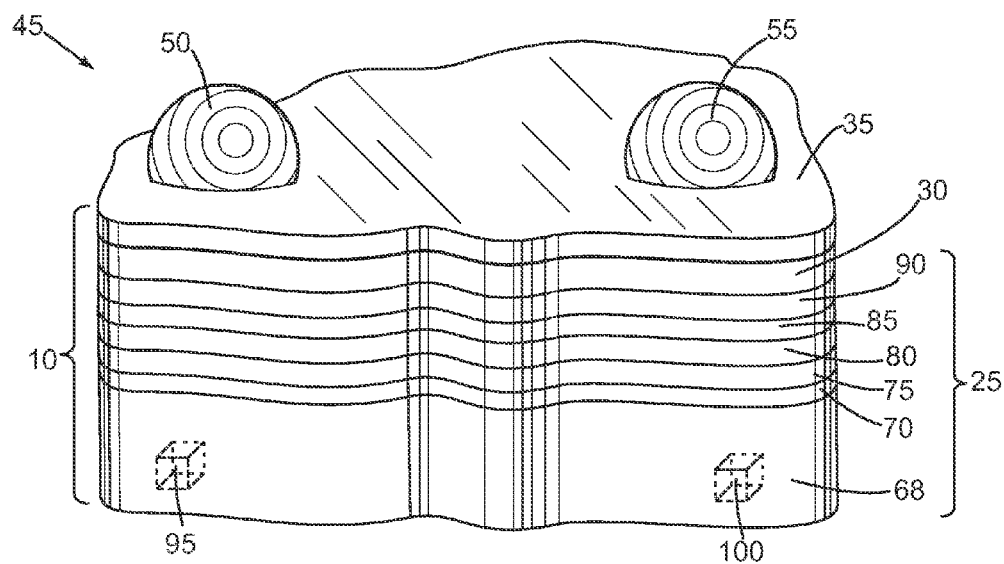
FIG. 2 is a pictorial view of a small portion removed from the semiconductor chip depicted in FIG. 1.

Additional details of the semiconductor chip 10 may be understood by referring now to FIG. 2, which is the portion of the semiconductor depicted in FIG. 1 circumscribed by the dashed oval 45 lifted out of the semiconductor and shown at a greater magnification. As noted above, the portion 45 includes the solder bumps 50 and 55, the insulating layer 35, the passivation structure 30 and the semiconductor portion 25. The semiconductor portion 25 may consist of a set of stacked layers that includes a semiconductor layer 68 and multiple interconnect layers 70, 75, 80, 85 and 90. The layers 70, 75, 80, 85 and 90 may consist of successive metallization layers interspersed with interlevel dielectric material. While five interconnect layers 70, 75, 80, 85 and 90 are depicted, it should be understood that virtually any number could be used. The interconnect layers 70, 75, 80, 85 and 90 provide electrical pathways between the solder bumps 50 and 55 (and the entire array 40 shown in FIG. 1) and internal circuit structures within the semiconductor portion 68, two of which are represented schematically by the dashed boxes 95 and 100.

The passivation structure 30 may be monolithic or consist of a plurality of alternating layers of different dielectric materials. In an exemplary embodiment, the passivation structure 30 may consist of, starting from the bottom and proceeding upward, alternating layers of silicon nitride and undoped silicate glass. The layers of silicon nitride and undoped silicate glass may total three each and have a total thickness of about 4.0 to 15.0 microns.

Figure 3A:
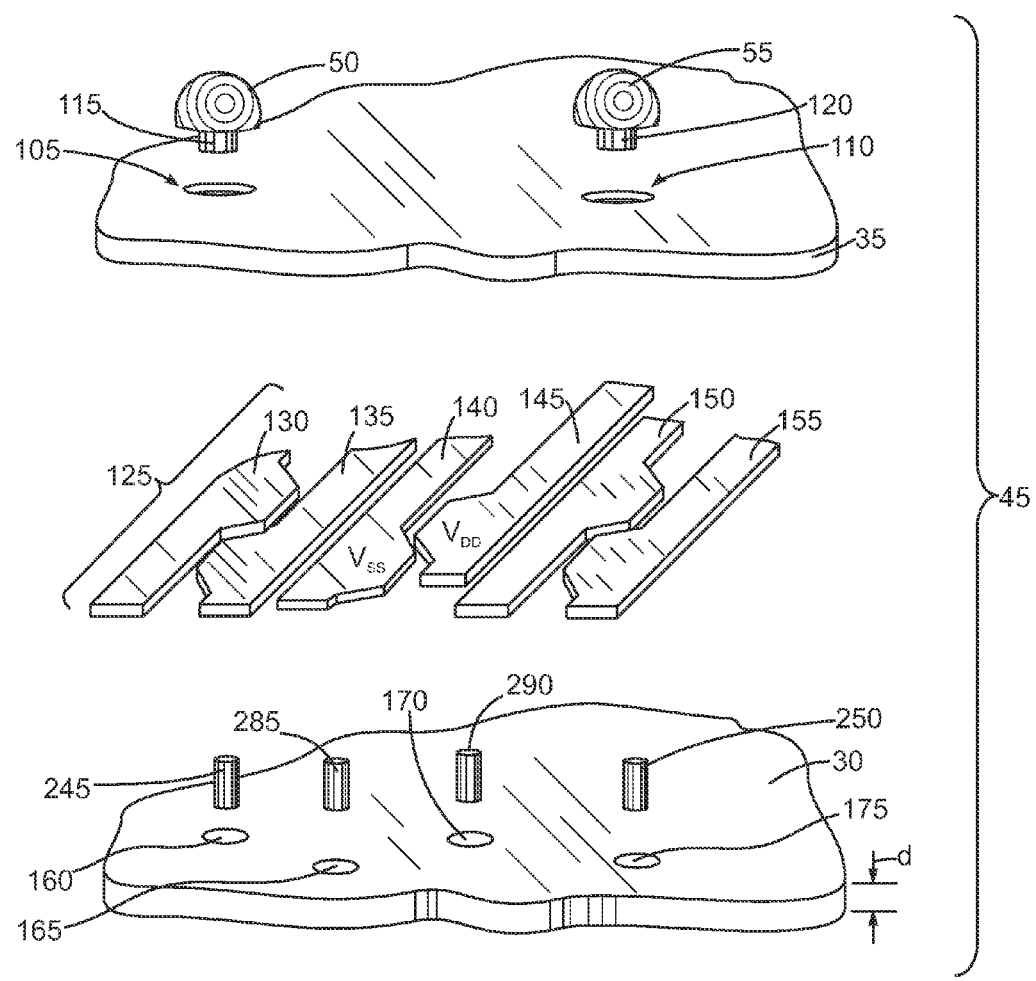
FIGS. 3A and 3B together depict a partially exploded pictorial view of the portion of the semiconductor chip depicted in FIG. 2.
Figure 3B:
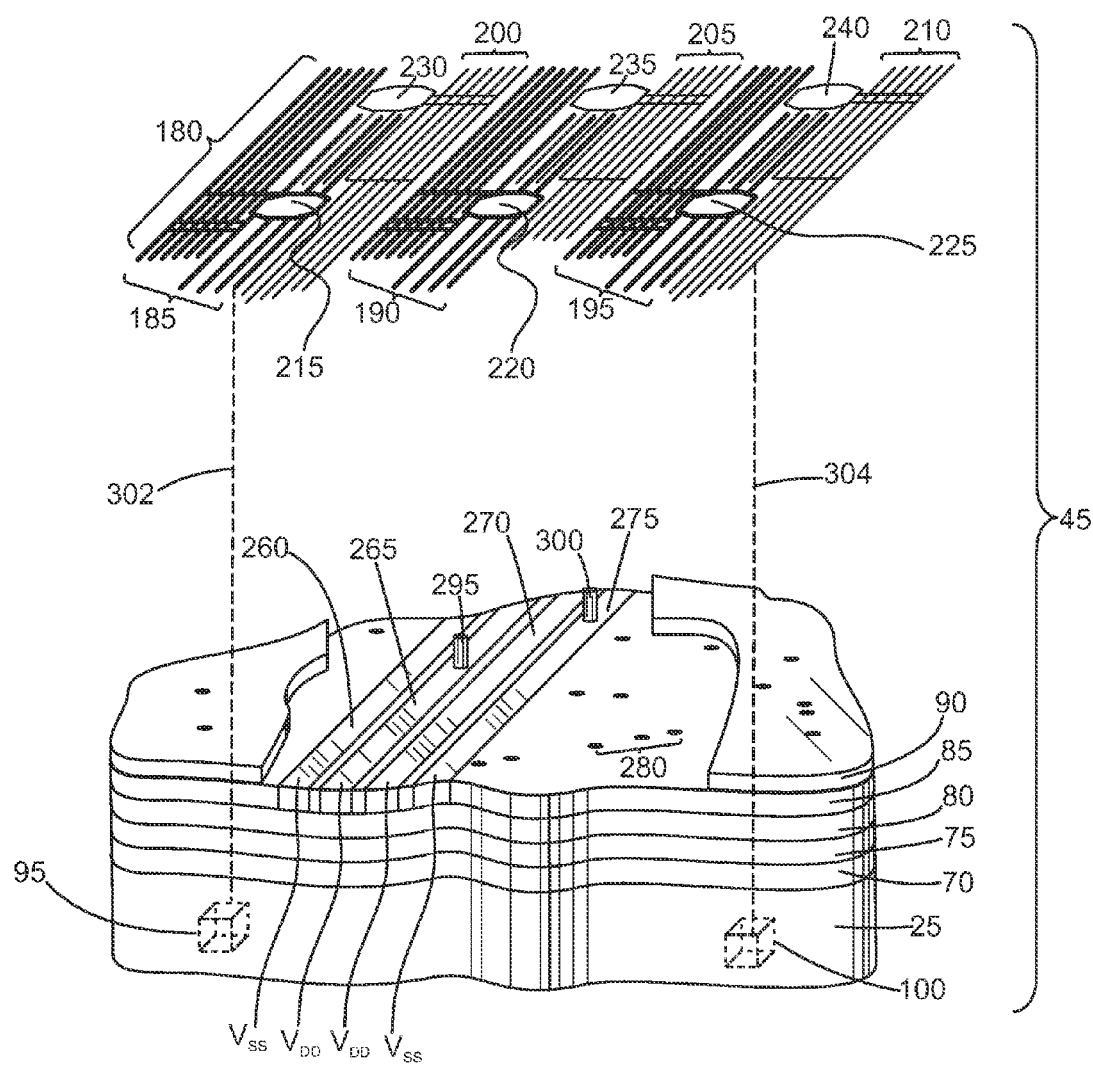

Further details of the semiconductor chip 10 may be understood by referring now to FIGS. 3A and 3B, which depict a partially exploded view of the portion 45 depicted in FIG. 2. The solder bumps 50 and 55 are shown exploded from the polymer layer 35 to reveal a pair of openings 105 and 110. The openings 105 and 110 are advantageously formed by well-known lithographic patterning and etching processes. The solder bumps 50 and 55 are formed with respective projections 115 and 120 in the openings 105 and 110 by well-known solder deposition and forming techniques. The polymer layer 35 is positioned over an under bump metallization (UBM) layer 125 that consists of a plurality of UBM structures, six of which are visible and labeled 130, 135, 140, 145, 150 and 155, respectively. It should be understood that the term "UBM" could apply equally to a configuration that uses other than bumps, such as pillars. Since FIG. 3 depicts only a small portion 45 of the semiconductor chip 10 shown in FIG. 1, it should be understood that the UBM structures 130, 135, 140, 145, 150 and 155 may be much more extensive in length than what is shown. Furthermore, there may be scores, hundreds or even thousands of such UBM structures 130, 135, 140, 145, 150 and 155 depending upon the particular layout of the semiconductor chip 10. Since the polymer layer 35 is positioned over, as opposed to under, the UBM layer 125, the various UBM structures 130, 135, 140, 145, 150 and 155 may serve as routing, and in this illustrative embodiment, as plates of one or more capacitor structures that may be used to provide additional on-chip capacitance. The UBM structures 130, 135, 140, 145, 150 and 155 may be configured to carry power, ground or signals as desired. Assume for purposes of this illustration, that the UBM structures 130, 140 and 150 are connected to a ground potential $V_{SS}$ and the UBM structures 135, 145 and 155 are connected to some voltage potential $V_{DD}$. The voltage potential, $V_{DD}$, may represent a bias level for an on-chip power rail system. While the UBM structures 130 and 135 and 150 and 155 may be tailored to provide ground and power routing, the UBM structures 140 and 145 may be set aside for capacitor structures. Before turning to a more complete description of the capacitor structures, the remainder of the structures in FIG. 3 will be described at this point. The aforementioned passivation structure 30 is positioned below the UBM layer 125 and is provided with a plurality of openings 160, 165, 170 and 175 that may be formed by well-known lithographic patterning and etching techniques. Positioned below the passivation structure 30 is an uppermost interconnect layer 180 that may be termed a "redistribution layer." The redistribution layer 180 is usually configured to route power, ground and signals to various other locations in the semiconductor chip 10. Assume for the purposes of this illustration, that the redistribution layer 180 includes respective groups 185, 190 and 195 of conductor lines that are connected to power, and respective groups 200, 205 and 210 that are connected to ground. For ease of visibility, the groups 185, 190 and 195 of conductor lines are shown with a thicker line weight than the groups 200, 205 and 210 of conductor structures. The conductor lines of the group 185 may be commonly tied to one or more conductor pads, one of which is shown and labeled 215. The groups 190 and 195 of conductor lines may be commonly connected to respective conductor pads 220 and 225. The groups 200, 205 and 210 of conductor lines may be similarly commonly connected to respective conductor pads 230, 235 and 240. The UBM structure 135 may be electrically connected to the group 185 of conductor lines by way of a conductor structure or via 245 that projects through the opening 160. The UBM structure 155 may be similarly electrically connected to the group 195 of conductor lines by way of a via 250 that projects down through the opening 175 and is metallurgically bonded to the conductor pad 225.

A portion of the interconnect layer 90 is shown cut away to reveal a few conductor lines of the next metallization layer beneath the redistribution layer 180. In this regard, a few conductor lines 260, 265, 270 and 275 are visible but would ordinarily be covered by insulating material that is otherwise shown cut away. Connections down through the layers 70, 75, 80, 85 and 90 may be provided through large numbers of openings, a few of which are labeled collectively 280. The line 260 may be at ground, $V_{SS}$, the lines 265 and 270 may be at power, $V_{DD}$, and the line 275 may be at ground, $V_{SS}$. An electrical connection between the line 260 and the UBM structure 140 may be provided by a via 285 that is positioned in the opening 165 and metallurgically connected to the UBM structure 140. The UBM structure 145 may be connected to the conductor line 270, which is at $V_{DD}$, by way of a via 290 that is positioned in the opening 170 in the passivation structure 30 and is metallurgically bonded to the UBM structure 145. The conductor pad 220 and thus the group 190 of conductors may be connected to the conductor line 265, which is at $V_{DD}$, by way of a via 295 that would be positioned in one of the openings 280 in the layer 90 which is not visible because the layer 90 is shown partially cut away. The conductor pad 235 and thus the group 205 of conductors may be similarly connected to the ground line 275 by way of a corresponding via 300.

The redistribution layer 180 and in particular the groups of conductor lines 185 and 210 thereof may be used to route power and/or ground or signals down to the circuit structures 95 and 100 in the semiconductor portion 25 of the semiconductor 10. That routing is represented by the dashed lines 302 and 304, respectively. It should be understood that the dashed lines 305 and 310 are schematic representations of what may be various metallization structures, e.g., lines and vias, in the different layers 70, 75, 80, 85 and 90.

With the arrangement of connections associated with the UBM structures 140 and 145 and the underlying groups 190 and 195 of conductor lines, capacitive structures may be provided. In this regard, a capacitive structure is provided by the combination of the UBM structure 140 at $V_{SS}$ and the underlying group 190 of conductor lines at $V_{DD}$ that is not ohmically connected, that is, not shorted to the UBM structure 140, and the passivation structure 30 sandwiched between the two. Similarly, the combination of the UBM structure 145 at $V_{DD}$ and the underlying group 205 of conductor lines at $V_{SS}$, and the passivation structure 30 sandwiched between the two makes up another capacitor structure. The capacitance, C, for the capacitor consisting of the UBM structure 140, the underlying group 190 of conductor lines and the passivation structure 30 is given by:

$$C = \in A/d \qquad (1)$$

where $\in$ is the dielectric constant of the passivation structure 30, A is the area of overlap between the UBM structure 140 and the plural conductor lines 190, and d is the thickness of the passivation structure 30. The capacitance of the capacitor consisting of the UBM structure 140, the underlying plural conductor lines 195 and the passivation structure 30 is also given by Equation 1, albeit with an overlap area that is appropriate for the UBM structure 145 and the conductor lines 195. The dielectric constant C for a laminate passivation structure consisting of, in this illustrative embodiment, alternating layers of silicon nitride and undoped silicate glass can be approximated with a reasonable degree of accuracy by:

$$\varepsilon \approx \frac{\sum_{1}^{k} \varepsilon_n t_n}{\sum_{1}^{k} t_n} \qquad (2)$$

Where $\in_n$ is the dielectric constant for a given layer in the laminate, $t_n$ is the thickness of a given layer, and n is the number of layers.

Figure 4:
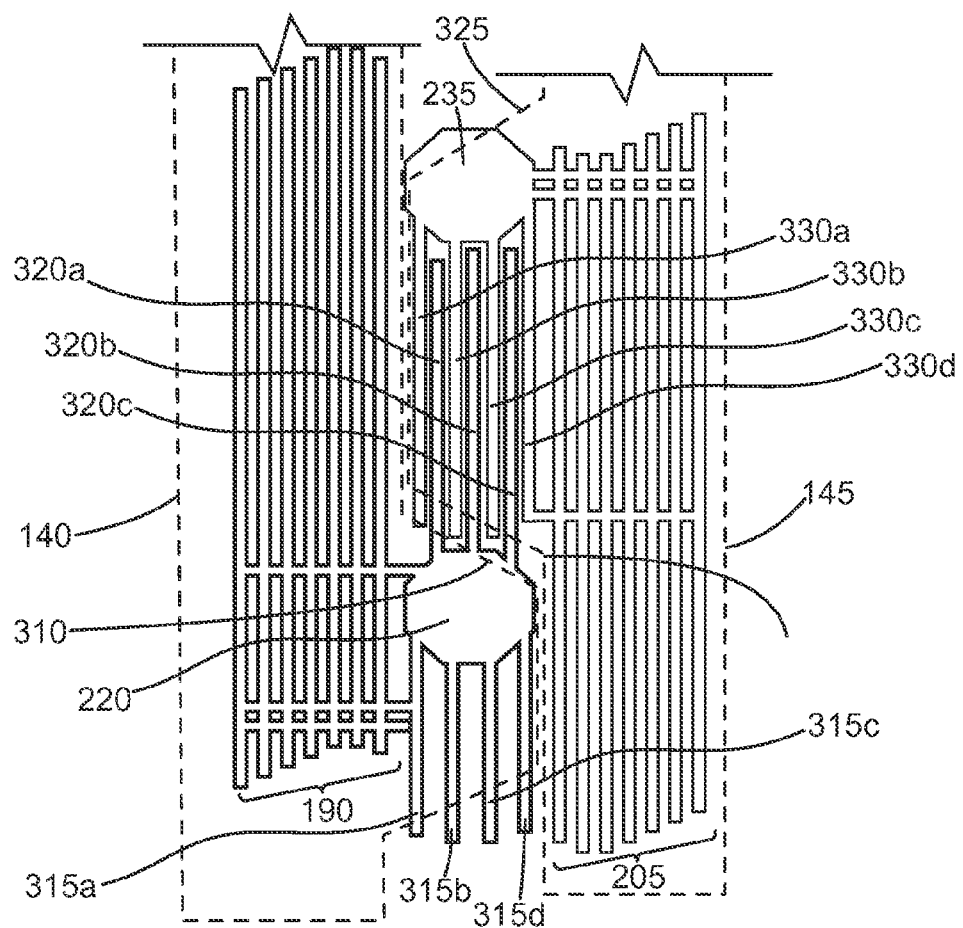
FIG. 4 is an overhead view of a portion of the semiconductor chip depicted in FIG. 3.

Additional detail of the capacitor structures may be understood by referring now to FIG. 4, which is an overhead view of the conductor pad 220 and the group 190 of conductor structures, and the conductor pad 235 and the group 205 of conductor structures with the overlying UBM structures 140 and 145 shown in dashed. It should be understood that the dashed lines do not represent a buried structure as would be the case in conventional drawing depictions. Instead, the dashed lines are used to depict the UBM structures 140 and 145 overlying the underlying plural conductor lines 190 and 205, respectively. A slightly heavier line weight is used to distinguish the group 190 from the group 205. Note that the UBM structure 140 includes a projection 310 that extends over the conductor pad 220. Additional capacitive overlap with the UBM structure 140 may be provided by forming additional conductor lines 315a, 315b, 315c and 315d that project away from the conductor pad 220. Additional conductor lines 320 may also be formed in contact with conductor pad 220 but extending in the opposite direction of the conductor lines 315 in order to provide additional areas for connections to layers below the group 190 of conductors. The UBM structure 145 may be similarly formed with a projection 325 that extends toward the group 190 of conductor lines. In order to provide additional overlap between the projection 325 and conductor structures connected to the group 205 of conductor lines 205 and the conductor pad 235, additional conductor lines 330a, 330b, 330c and 330d may be formed in contact with the conductor pad 235 as shown. Indeed, the conductor lines 330 may interweave with the conductor lines 320a, 320b and 320c that are connected to the conductor pad 220 as shown if desired.

Figure 5:
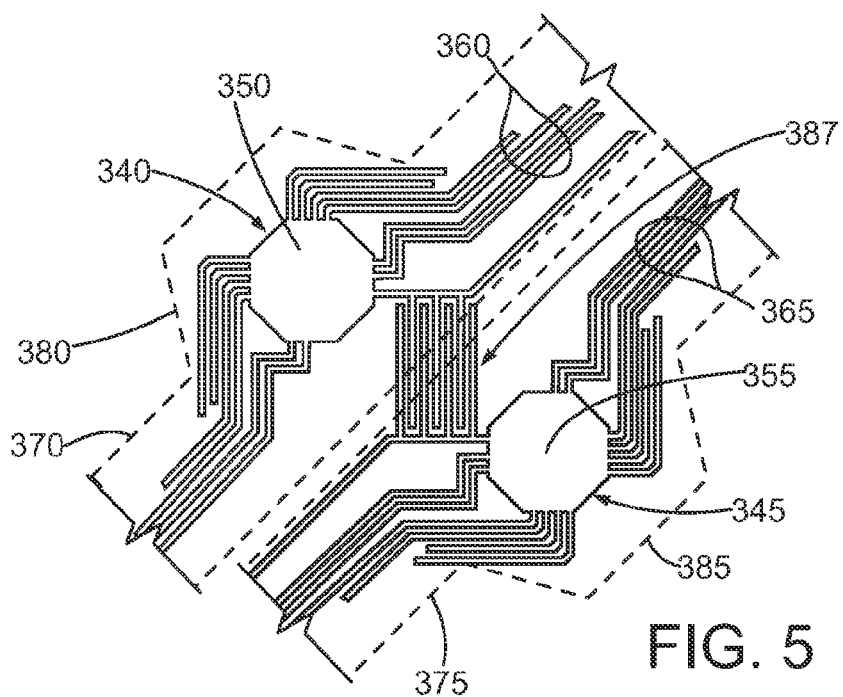
FIG. 5 is an overhead view of a portion of an alternate exemplary embodiment of a semiconductor chip.

The skilled artisan will appreciate that the layout of the UBM structures and the underlying redistribution layer conductors is subject to great variety. An alternate exemplary embodiment is illustrated in FIG. 5, which is an overhead view like FIG. 4, but in this case of respective pluralities of conductor structures 340 and 345. The conductor structures 340 include a conductor pad 350 and the conductor structures 345 include a conductor pad 355. Plural conductor lines 360 are connected to the pad 350 and plural conductor lines 365 are connected to the pad 355. Again, these lines 360 and 365 may connect to a myriad of other conductor structures that are positioned beneath the plural conductors 340 and 345. To establish capacitor structures, a pair of UBM structures, shown and depicted with dashed lines 370 and 375, are used. It should be understood that the UBM structures 370 and 375, while depicted in dashed lines, are actually above, i.e., closer to the reader than the plural conductors 340 and 345. Like the UBM structures 140 and 145 depicted in FIG. 4, the UBM structures 370 and 375 include respective projections 380 and 385 that provide greater overlap with the combinations of the pad 350 and plural lines 360 and the pad 355 and plural lines 365. As with the other illustrative embodiment, the various conductor lines of the respective pluralities of conductor lines 340 and 345 may be nested as shown in the region 387. This alternative embodiment uses an angular layout for the UBM structures 370 and 375 and redistribution conductors 340 and 345. An angular construction may yield higher packing density.

Figure 6:
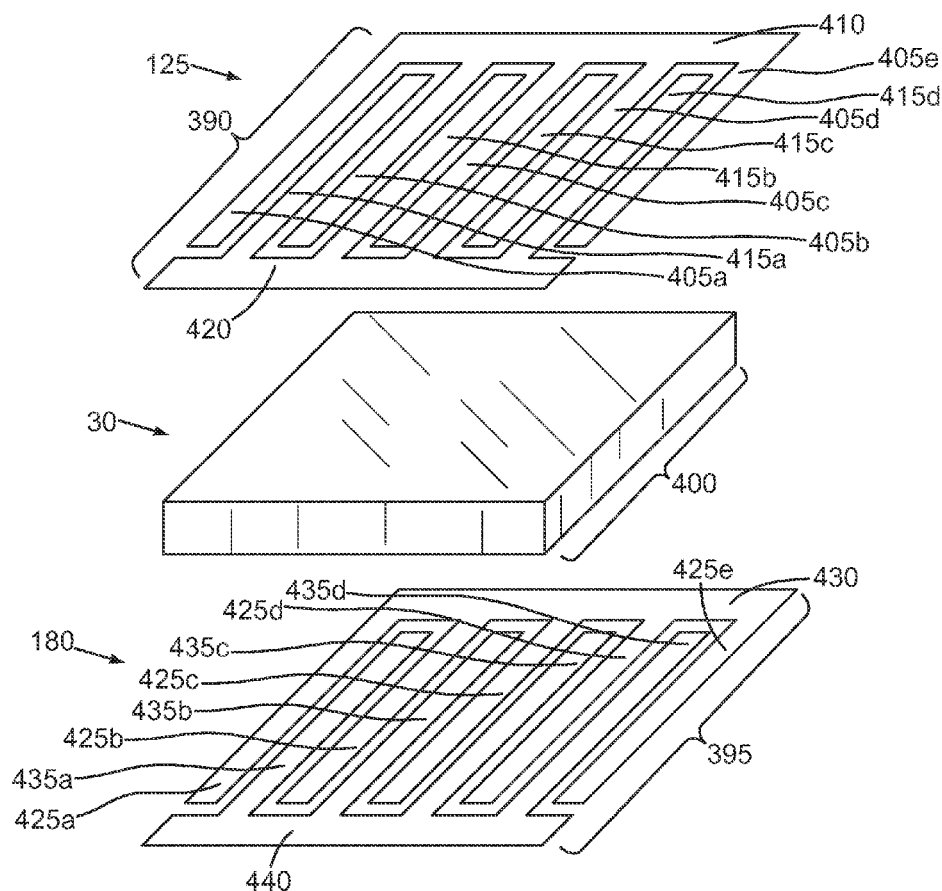
FIG. 6 is a partially exploded pictorial view of an exemplary embodiment of a capacitor of the semiconductor chip.

Only small portions of the UBM layer 125 and the redistribution layer 180 are shown In FIGS. 3 and 4. However, as mentioned briefly above, large portions of the UBM layer 125 and the redistribution layer 180 may be set aside for capacitor functionality. In this regard, attention is now turned to FIG. 6, which is an exploded pictorial view of such a portion 390 of the UBM layer 125 and another portion 395 of the redistribution layer 180. A portion 400 of the passivation structure 30 is depicted between the portions 390 and 395 of the UBM layer 125 and the redistribution layer 180. The portion 390 may consist of plural fingers 405a, 405b, 405c, 405d and 405e tied together by a line 410 and a corresponding plurality of fingers 415a, 415b, 415c and 415d nested within the fingers 405a, 405b, 405c, 405d and 405e. The fingers 415a, 415b, 415c and 415d may be tied to a common line 420. The portion 395 of the redistribution layer 180 may be similarly constructed with a plurality of fingers 425a, 425b, 425c, 425d and 425e connected to a common line 430 and a plurality of fingers 435a, 435b, 435c and 435d tied to a common line 440. The combination of: (1) the fingers 405a, 405b, 405c, 405d and 405e and common line 410; (2) the portion 400 of the passivation structure 30; and (3) the underlying fingers 425a, 425b, 425c, 425d and 425e and common line 430 may form one large capacitive structure. Similarly, the combination of: (1) the fingers 415a, 415b, 415c and 415d: (2) the portion 400 of the passivation structure 30; and (3) the underlying fingers 435a, 435b, 435c and 435d of the redistribution layer 180 may make up yet another large capacitor structure. It should be understood that the various fingers 405a, 405b, 405c, 405d and 405e, 415a, 415b, 415c and 415d, and lines 410 and 420 are schematic representations in that such conductor structures may actually be formed from groupings of much smaller conductor structures of the redistribution layer 180 depicted in FIG. 3. For example, the finger 425a might consist of the group 190 of conductor lines shown in FIG. 3 and the overlying finger 405a might consist of the UBM structure 140 also shown in FIG. 3. Optionally, a given finger might consist of multiple groupings of UBM structures or RDL conductors.

Figure 7:
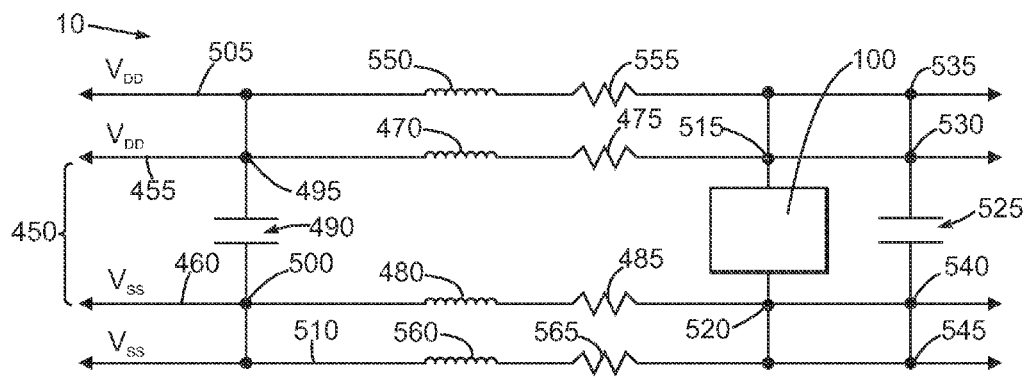
FIG. 7 is schematic view of an exemplary power and ground circuit for an exemplary semiconductor chip including an on-chip capacitor.

A portion of the basic power/ground network for the semiconductor chip 10 may be understood by referring now to FIG. 7, which is a schematic view. The on-chip power grid 450 consists of a power rail 455 and a ground rail 460. The power and ground rails 455 and 460 provide power and ground to various portions of the semiconductor chip 10, such as the cell 100. The cell 100 (also shown in FIGS. 2 and 3) may be virtually any circuit or block of circuitry that may benefit from decoupling capacitance. An inductance 470 and a resistance 475 are associated with a power rail 455. An inductance 480 and a resistance 485 are associated with a ground rail 460. An on-chip decoupling capacitor 490 is connected between the power and ground rails 455 and 460 at the nodes 495 and 500. The on-chip capacitor 490 may consist of one or many on-chip capacitors that may be configured as well-known MOS or other types of capacitive structures frequently used in integrated circuits. In addition, portions of the UBM layer and redistribution layer (see FIGS. 2 and 3) are used as power and ground rails 505 and 510. The power and ground rails 505 and 510 are electrically connected to the on-chip capacitor 490 at nodes 495 and 500, respectively. In addition, the power and ground rails 505 and 510 are connected to the cell 100 at the nodes 515 and 520. The on-chip capacitor 490 may be supplemented with a UBM-redistribution layer capacitor 525 that is connected across the power rails 455 and 505 at nodes 530 and 535 and to the ground rails 460 and 510 at the nodes 540 and 545. The UBM/RDL capacitor 525 may be implemented, in a simple form, by way of, for example, the combination of the UBM structure 140, the passivation layer structure 30 and the group 190 of conductor lines depicted in FIG. 3. Optionally, the UBM/RDL capacitor 525 may consist of a much more complex grouping and arrangement of portions of the UBM layer 125 and the RDL layer 180 depicted in FIGS. 3 and 6. It should be understood that the power rail 505 has an inductance 550 and a resistance 555 associated therewith. Similarly, the ground rail 510 has an inductance 560 and a resistance 565 associated therewith. However, by using the UBM layer 125 and the redistribution layer 180 as shown in FIG. 3, the UBM/RDL capacitor 525 may be positioned very close to the cell 100 and thus yield low values of the inductances 550 and 560, which will yield better device performance.

Figure 8:
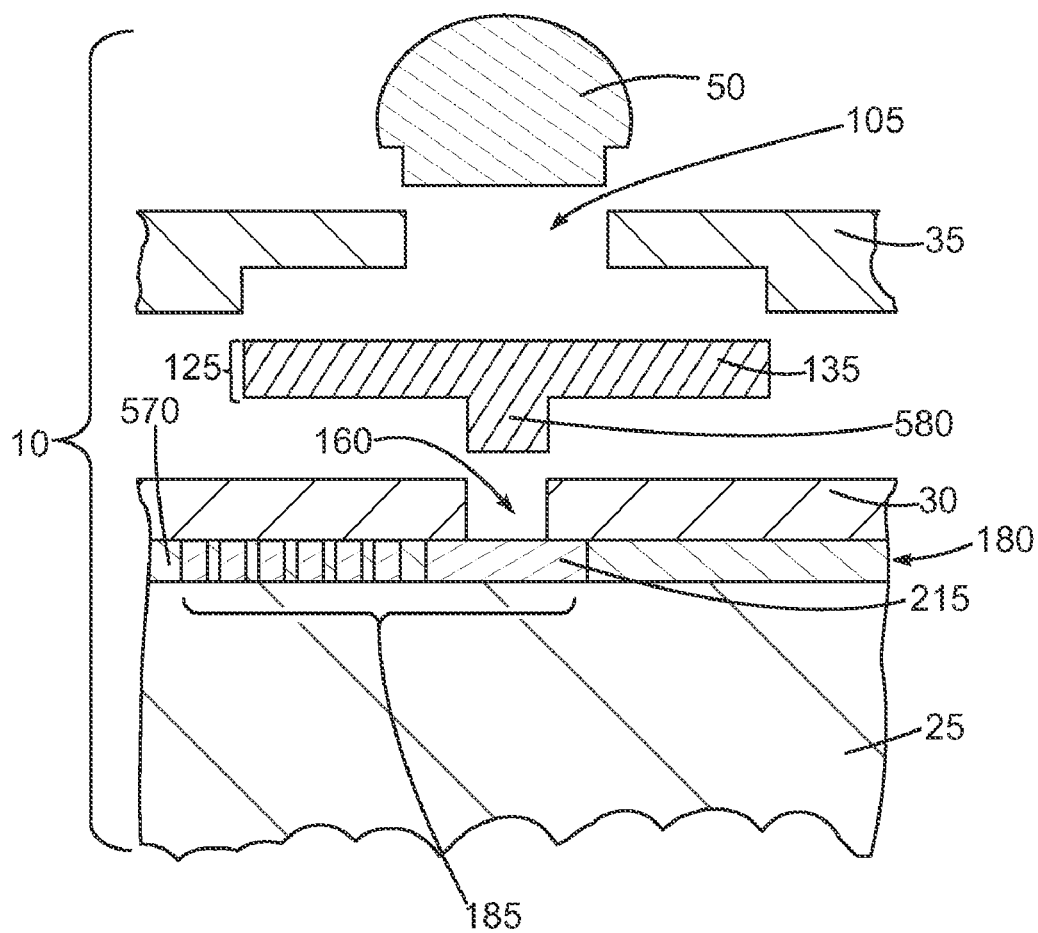
FIG. 8 is a partially exploded sectional view of an exemplary under bump metallization and redistribution layer arrangement for a semiconductor chip.

An exemplary process for fabricating elements that make up a UBM/RDL capacitor may be understood by referring now to FIG. 8, which is an exploded sectional view. The UBM structure 135 and the portion of the RDL 180 that includes the group 185 of conductor lines and associated conductor pad 215 depicted in FIG. 3 will be used to illustrate the process in FIG. 8. It should be understood that FIG. 8 depicts just a small portion of the semiconductor chip 10 and its semiconductor layer 25. The RDL 180 may be formed by establishing appropriate openings in an interlevel dielectric layer 570 composed of silicon oxides, glasses or the like using well-known lithography processes. Metal materials may be deposited in the openings to form the group 185 of conductor lines and associated conductor pad 215. The group 185 of conductor lines and associated conductor pad 215 may be composed of a variety of conductor materials, such as aluminum, copper, silver, gold, titanium, refractory metals, refractory metal compounds, alloys of these or the like, and formed by plating, physical vapor deposition or other material deposition techniques.

The passivation structure 30 may be formed on the RDL 180 by depositing one or more layers of insulator materials, such as silicon nitride and undoped silicate glass. The opening 160 is formed in the passivation layer 30 down to the conductor pad 215 by well-known lithographic patterning and etching processes.

The UBM structure 135 is formed on the passivation layer 30 so as to fill the opening 160. The portion 580 extending to the pad 215 may be integral with the UBM structure or be a separate via structure (e.g., via 245 shown in FIG. 3). The entirety of the UBM layer 125 may be formed at this time. The UBM structure 135 may be composed of a variety of conductor materials, such as aluminum, copper, silver, gold, titanium, refractory metals, refractory metal compounds, alloys of these or the like. In lieu of a unitary structure, the UBM structure 135 may consist of a laminate of plural metal layers, such as a titanium layer followed by a nickel-vanadium layer followed by a copper layer. In another embodiment, a titanium layer may be covered with a copper layer followed by a top coating of nickel. However, the skilled artisan will appreciate that a great variety of conducting materials may be used for the UBM structure 135. Various well-known techniques for applying metallic materials may be used, such as physical vapor deposition, chemical vapor deposition, plating or the like. It should be understood that additional conductor structures could be interposed between the UBM structure 135 and the conductor pad 215.

The polymer layer 35 is deposited on the UBM layer 125 to provide passivation and cushion against differences in thermal expansion of the semiconductor chip 10, the UBM structure 135 and the subsequently formed solder bump 50. Exemplary materials for the insulating layer 35 include, for example, polymeric materials such as polyimide and benzocyclobutene or the like, or other insulating materials such as silicon nitride or the like. Spin coating, chemical vapor deposition or other deposition processes may be used. The polymer layer 35 is patterned lithographically with the opening 105 that exposes a portion of the UBM structure 135.

To form the solder bump 50, an appropriate mask or stencil (not shown) of well-known composition is applied to the polymer layer 35 and solder as disclosed elsewhere herein is applied. The mask is removed and a reflow process is performed. A coining step may be performed if desired.

Any of the exemplary embodiments disclosed herein may be embodied in instructions disposed in a computer readable medium, such as, for example, semiconductor, magnetic disk optical disk or other storage medium or as a computer data signal. The instructions or software may be capable of synthesizing and/or simulating the circuit structures disclosed herein. In an exemplary embodiment, an electronic design automation program, such as Cadence APD or the like, may be used to synthesize the disclosed circuit structures. The resulting code may be used to fabricate the disclosed circuit structures. In another exemplary embodiment, a simulation program, such as a high frequency SPICE simulator or the like, may be used to simulate the electrical behavior of the disclosed circuit structures.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing a capacitor, comprising:
   forming a first conductor structure on a semiconductor chip to serve as a first capacitor plate, the first conductor structure including a layer;
   forming a passivation structure on the first conductor structure;
   forming an under bump metallization structure on the passivation structure overlapping the first conductor structure to serve as a second capacitor plate; and
   applying a polymer layer to the under bump metallization structure, the polymer layer providing structural protection for the underbump metallization structure.

2. The method of claim 1, wherein the forming the first conductor structure comprises forming a redistribution interconnect layer.

3. The method of claim 1, wherein the forming the passivation structure comprises forming a laminate of plural insulator layers.

4. The method of claim 1, comprising forming a second conductor structure on the under bump metallization structure.

5. The method of claim 4, wherein the forming the second conductor structure comprises forming a solder bump.

6. The method of claim 1, wherein the semiconductor chip comprises a power rail and a ground rail, the method comprising connecting a combination of the first conductor structure, the passivation structure and the under bump metallization structure across the power and ground rails.

7. The method of claim 1, comprising coupling the semiconductor chip to a circuit board.

8. The method of claim 7, comprising mounting the circuit board in a computing device.

9. The method of claim 1, wherein the first conductor structure, the passivation structure and the under bump metallization structure are embodied in instructions stored in a computer readable medium, the method comprising fabricating the first conductor structure, the passivation structure and the under bump metallization structure using those instructions.

10. The method of claim 1, wherein the layer comprises a first plurality of commonly tied lines and the under bump metallization structure overlaps at least a portion of the first plurality of commonly tied lines.

11. A method of manufacturing, comprising:
    forming a redistribution layer on a semiconductor chip, the redistribution layer having a first conductor structure to serve as a first capacitor plate;
    forming a passivation structure on the redistribution layer;
    forming an under bump metallization layer on the passivation structure, the under bump metallization layer having plural under bump metallization structures;
    wherein at least one of the under bump metallization structures serves as a second capacitor plate and overlaps at least partially with the first conductor structure to provide a first capacitor; and
    applying a polymer layer to the under bump metallization structure, the polymer layer providing structural protection for the under bump metallization structure.

12. The method of claim 11, comprising connecting the first conductor structure to a ground rail or a power rail.

13. The method of claim 11, wherein the forming the passivation structure comprises forming a laminate of plural insulator layers.

14. The method of claim 11, comprising forming conductor structures on at least some of the plural under bump metallization structures.

15. The method of claim 14, wherein the forming the conductor structures comprises forming solder bumps.

16. The method of claim 11, wherein the semiconductor chip comprises a power rail and a ground rail, the method comprising connecting a combination of the first conductor structure, the passivation structure and the at least one under bump metallization structure across the power and ground rails.

17. The method of claim 11, comprising coupling the semiconductor chip to a circuit board.

18. The method of claim 17, comprising mounting the circuit board in a computing device.

19. The method of claim 11, wherein the first conductor structure, the passivation structure and the under bump metallization structure are embodied in instructions stored in a computer readable medium, the method comprising fabricating the first conductor structure, the passivation structure and the under bump metallization structure using those instructions.

20. An apparatus, comprising:
    a semiconductor chip having a first conductor structure to serve as a first capacitor;
    a passivation structure on the first conductor structure;
    an under bump metallization structure on the passivation structure overlapping at least a portion of the first conductor structure but not being ohmically connected to the first conductor structure to serve as a second capacitor plate and establish a capacitor; and a polymer layer on the under bump metallization structure, the polymer layer providing structural protection for the under bump metallization structure.

21. The apparatus of claim 20, wherein the first conductor structure comprises a redistribution interconnect layer.

22. The apparatus of claim 20, wherein the passivation structure comprises a laminate of plural insulator layers.

23. The apparatus of claim 20, comprising a second conductor structure on the under bump metallization structure.

24. The apparatus of claim 23, wherein the second conductor structure comprises a solder bump.

25. The apparatus of claim 20, wherein the semiconductor chip comprises a power rail and a ground rail, a combination of the first conductor structure, the passivation structure and the under bump metallization structure being electrically connected across the power and ground rails.

26. The apparatus of claim 20, comprising a circuit board coupled to the semiconductor chip.

27. The apparatus of claim 26, comprising a computing device coupled to the circuit board.

28. A method of manufacturing a first capacitor and a second capacitor, comprising:

forming a first conductor structure on a semiconductor chip to serve as a first capacitor plate, the first conductor structure including a layer, the layer having a first plurality of commonly tied lines;

forming a passivation structure on the first conductor structure;

forming a first under bump metallization structure on the passivation structure overlapping at least a portion of the first plurality of commonly tied lines to serve as a second capacitor plate;

forming a second conductor structure on the semiconductor chip beneath the passivation structure to serve as a third capacitor plate, the second conductor structure including a second plurality of commonly tied lines, at least one of the second plurality of commonly tied lines being nested between two of the first plurality of commonly tied lines; and forming a second under bump metallization structure on the passivation structure overlapping at least a portion of the second conductor structure to serve as a fourth capacitor plate.

29. A method of manufacturing, comprising:

forming a redistribution layer on a semiconductor chip, the redistribution layer having a first conductor structure to serve as a first capacitor plate and including a first plurality of commonly tied lines and a second conductor structure to serve as a second capacitor plate, the second conductor structure including a second plurality of commonly tied lines, at least one of the second plurality of commonly tied lines being nested between two of the first plurality of commonly tied lines;

forming a passivation structure on the redistribution layer;

forming an under bump metallization layer on the passivation structure, the under bump metallization layer having plural under bump metallization structures; and wherein at least one of the under bump metallization structures serves as a third capacitor plate and overlaps at least partially with the first conductor structure to provide a first capacitor and another of the underbump metallization structures serves as a fourth capacitor plate and overlaps at least partially with the second conductor structure to provide a second capacitor.

30. An apparatus, comprising:

a semiconductor chip having a first conductor structure to serve as a first capacitor plate and a second conductor structure to serve as second capacitor plate, the first conductor structure including a layer having a first plurality of commonly tied lines and the second conductor structure including a layer having a second plurality of commonly tied lines, at least one of the second plurality of commonly tied lines being nested between two of the first plurality of commonly tied lines;

a passivation structure on the first conductor structure and the second conductor structure; and a first under bump metallization structure on the passivation structure overlapping at least a portion of the first conductor structure but not being ohmically connected to the first plurality of commonly tied lines to serve as a third capacitor plate and establish a first capacitor and a second under bump metallization structure on the passivation structure overlapping at least a portion of the second conductor structure but not being ohmically connected to the second plurality of commonly tied lines to serve as a fourth capacitor plate.

* * * * *